United States Patent [19]

Neilson et al.

[11] Patent Number: 4,639,762

[45] Date of Patent: Jan. 27, 1987

[54] MOSFET WITH REDUCED BIPOLAR EFFECTS

[75] Inventors: John M. S. Neilson, Norristown, Pa.; Norbert W. Brackelmanns, Ironia, N.J.

[73] Assignee: RCA Corporation, Princeton, N.J.

[21] Appl. No.: 605,427

[22] Filed: Apr. 30, 1984

[51] Int. Cl.⁴ .................... H01L 29/78; H01L 29/06
[52] U.S. Cl. .................... 357/23.8; 357/23.4; 357/20; 357/86
[58] Field of Search ........ 357/23.8, 23.4, 20, 357/86, 36

[56] References Cited

U.S. PATENT DOCUMENTS

| | | | |
|---|---|---|---|
| 4,394,674 | 7/1983 | Sakuma et al. | 357/20 |
| 4,516,143 | 5/1985 | Love | 357/86 |
| 4,561,003 | 12/1985 | Tihanyi et al. | 357/20 |

FOREIGN PATENT DOCUMENTS 55-96672  7/1980  Japan ............................ 357/23.1

Primary Examiner—Martin H. Edlow
Assistant Examiner—Jerome Jackson
Attorney, Agent, or Firm—Birgit E. Morris; Donald S. Cohen; Kenneth R. Glick

[57] ABSTRACT

A MOSFET device comprises a semiconductor wafer which includes a drain region of first conductivity type contiguous with a wafer surface. A diffused body region of second conductivity type extends into the wafer from the wafer surface so as to form a body/drain PN junction which has a polygonally-shaped intercept at the wafer surface. A plurality of source regions of first conductivity type extends into the wafer from the wafer surface within the boundary of the body region. The source regions define a plurality of channel regions, a contact area, and at least one shunt region at the surface of the body region. Each shunt region extends from the contact area to one of the corners of the body/drain PN junction polygonal intercept. A source electrode contacts the body region contact area and each of the source regions adjacent thereto.

12 Claims, 6 Drawing Figures

MOSFET WITH REDUCED BIPOLAR EFFECTS

The present invention relates to insulated gate field effect transistors (IGFETs) such as metal oxide semiconductor FETs (MOSFETs). More particularly, the invention relates to MOSFETs which incorporate diffused body regions, such as vertical double diffused MOSFET (VDMOS) devices.

BACKGROUND OF THE INVENTION

A conventional MOSFET includes a semiconductor wafer having source, body and drain regions of alternate conductivity type disposed in series therein. A portion of the body region is located at a surface of the wafer and is bounded by a source/body PN junction and a body/drain PN junction so as to define a channel region in the body region adjacent to the wafer surface. An insulated gate electrode overlies this channel region on the wafer surface.

When a voltage greater than some threshold voltage is applied to the gate electrode, it produces an inversion in the conductivity type of the body region in that portion of the channel region that is contiguous with the wafer surface. The so-called inversion channel thereby produced permits a unipolar current flow between the source and drain regions. This unipolar electron flow (for N channel devices) or hole flow (for P channel devices) is selectively modulated by the voltage applied to the gate. However, this source/body/drain structure inherently also produces a parasitic NPN or PNP bipolar transistor which is detrimental to FET performance.

In a conventional MOSFET structure the body region is formed by diffusion (or implantation and diffusion) of an appropriate dopant through an aperture in a mask which is disposed on the wafer surface. The mask aperture is typically of a polygonal shape, such as square or hexagonal, and the mask may include a plurality of apertures, so as to form a plurality of body regions. In what is commonly referred to as a double diffused MOSFET, the source region is formed by diffusing an appropriate dopant of opposite conductivity type through the same mask aperture(s).

In a double diffused structure, the differential diffusion rate between the body region dopant and the source region dopant creates a spacing between the source/body PN junction and body/drain PN junction for each body region. At the semiconductor surface, this spacing defines the channel region in each body region. The length of the channel region is defined as the distance between the source/body PN junction and body/drain PN junction at a particular point, and might typically be in the range of a fraction of a micron to several microns. The width of the channel region is measured perpendicularly to its length.

However, this conventional polygonal channel region geometry intrinsically creates certain problems. The gain of the parasitic bipolar transistor and the threshold voltage of the MOSFET is nonuniform at different portions of the channel region. This occurs because in the corners of the polygonal channel regions there is a different dopant concentration profile compared to that along the edges of the polygonal channel regions.

SUMMARY OF THE INVENTION

A MOSFET device comprises a semiconductor wafer which includes a drain region of first conductivity type contiguous with a wafer surface. A diffused body region of second conductivity type extends into the wafer from the wafer surface so as to form a body/drain PN junction which has a substantially polygonal-shaped intercept at the wafer surface. A plurality of source regions of first conductivity type extends into the wafer from the wafer surface within the boundary of the body region. Each source region forms a source/body PN junction so as to define a channel region in the body region at the wafer surface. Within the body region each of the source/body PN junctions is also spaced from each other so as to define a contact area and at least one shunt region at the wafer surface. Each shunt region extends from the contact area to one of the corners of the body/drain PN junction polygonal intercept. A source electrode contacts the body region contact area and each of the source regions adjacent thereto.

DETAILED DESCRIPTION

Figures 1, 1A:
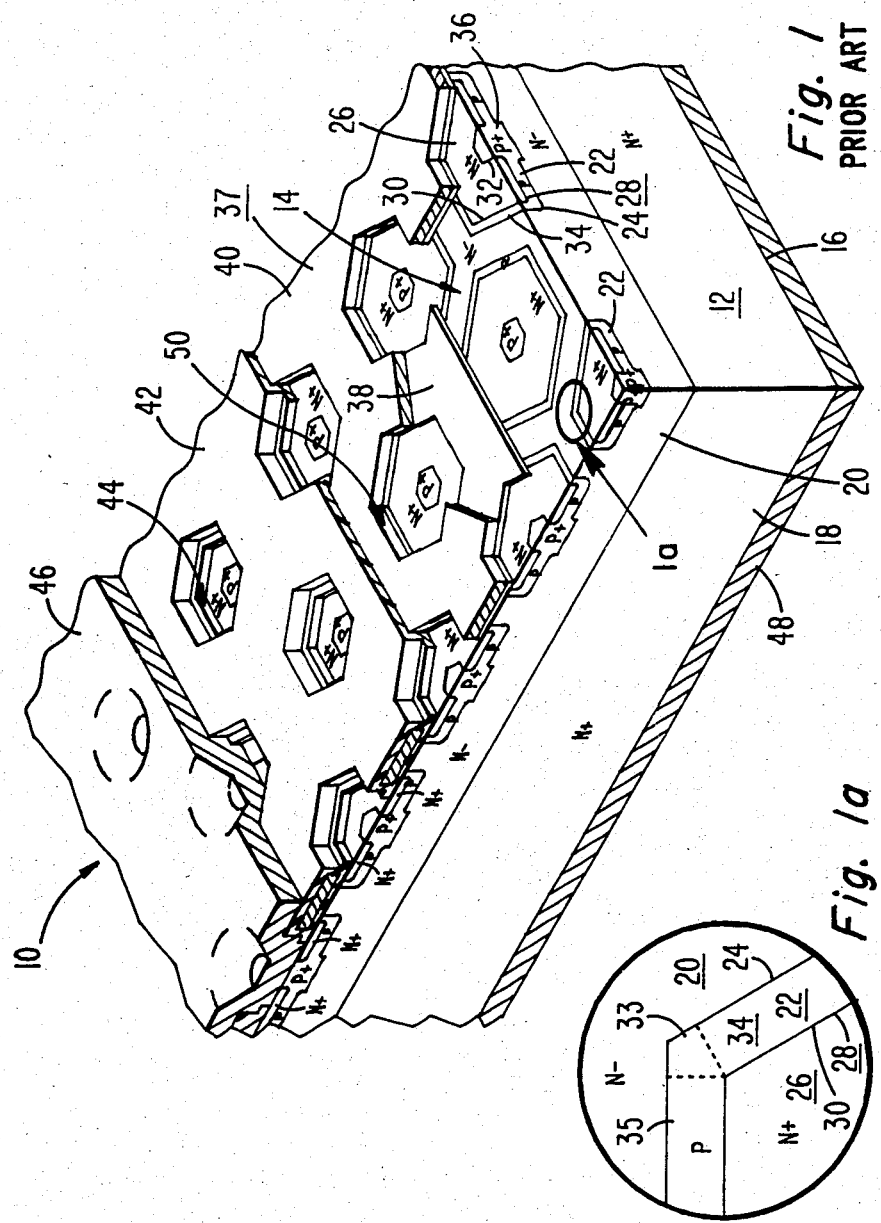
FIG. 1 is a perspective view, partially in section, of a conventional VDMOS device having a hexagonal body region structure.
FIG. 1A is a magnified view of a portion of FIG. 1.

Illustrated in FIG. 1 is a conventional VDMOS device 10 incorporating what is commonly referred to as a hexagonal cell structure. The device 10 comprises a substantially planar semiconductor wafer 12 of N type conductivity having first and second opposing major surfaces 14 and 16 respectively. The wafer 12 typically further comprises a relatively heavily doped substrate 18 contiguous with the second major surface 16 and a relatively lightly doped extended drain portion 20 disposed on the substrate 18 and contiguous with the first surface 14. The substrate 18 forms the device drain region and the lightly doped portion 20 is usually referred to as an extended drain region. This N- type extended drain region 20 is typically formed by epitaxial deposition and is typically uniformly doped during the epitaxial deposition process so as to yield a region of lower conductivity than the substrate 18.

A plurality of P type body regions 22 extends into the wafer 12 from the surface 14; each body region 22 forming a body/drain PN junction 24 with the extended drain region 20. As illustrated, the intercept of each body/drain PN junction 24 at the first surface 14 forms a hexagon, and the hexagons are spaced in a two dimensional array at the surface 14.

An N type conductivity source region 26 extends into the wafer from the first surface 14 within the boundary of each body region 22 and a source/body PN junction 28 occurs at the interface between the source and body regions. The source/body PN junction 28 intercepts the surface 14 so as to form a peripheral portion 30 and a central portion 32. The central portion 32 circumscribes a portion of the body region 22 which is of high conductivity relative to the remainder of the body region, and is hereinafter referred to as a body region contact area 36. The peripheral portion 30 is spaced from the body/drain PN junction 24 so as to define a channel region 34 in a portion of the body region 22 adjacent the surface 14.

The peripheral portion 30 has a similarly oriented hexagonal configuration which is concentric with and geometrically similar to the hexagonal first surface intercept of the body/drain PN junction 24. That is, with the exception of areas in the corners of the hexagons, the spacing between the body/drain PN junction 24 and the peripheral portion 30 of the source/body PN junction 28 is substantially uniform, as illustrated in FIG. 1A. FIG. 1A illustrates the configuration of the channel region 34 at a corner area 33 and a side area 35 of the body region 22. It should also be understood that the illustration shows a theoretical geometric configuration having a precise hexagonal shape, whereas the hexagons on an actual device will typically have somewhat rounded corners.

A gate oxide 38 is disposed on the wafer surface 14 over the channel portion 34 of each body region 22 and overlies the extended drain region 20 between body regions as well. Overlying the gate oxide 38 is a gate electrode 40 which typically comprises doped polycrystalline silicon, and which together with the gate oxide 38 is referred to as an insulated gate electrode 37. An insulating layer 42 overlies the insulated gate electrode 37 and defines a source contact aperture 44 to the source region 26 and body region contact area 36 associated with each of the body regions 22. A source electrode 46 overlies the insulating layer 42 and forms an ohmic contact to the source and body regions at the surface 14 via the apertures 44. A drain electrode 48 is disposed across the second wafer surface 16.

The body and source regions 22 and 26 in the device 10 are fabricated by what is commonly referred to as a double diffusion process, utilizing the insulated gate electrode 37 as a diffusion mask. This is a "self-aligned" process whereby following formation of the insulated gate electrode 37 with apertures 50 therein, the dopants for both the body and source regions are diffused, or implanted and diffused, into the wafer 12. The diffused source and body regions create a channel region which is automatically aligned to the overlying insulated gate electrode 37. Differences in processing parameters as well as differences in the diffusion rates of the dopant species create the spacing between the body/drain PN junction 24 and source/body PN junction 28.

Inherent in the double diffusion process is a dopant atom concentration gradient across the channel region 34. The dopant atom concentration decreases monotonically as measured from the source/body PN junction 28 to the body/drain PN junction 24. However, this gradient is not uniform at all points in the body region despite the fact that the body region is initially uniformly doped at the surface 14. Specifically, a lower dopant atom concentration exists at the areas 33 in the corners of each hexagonal channel region 34 than along the sides 35 of each hexagonal channel region, as illustrated in FIG. 1A. This occurs because the same number of dopant atoms per unit area diffuses out into a larger volume (i.e. there is an additional degree of freedom) at the corners.

This nonuniformity in channel region doping concentration gradient creates at least two undesirable effects: (1) the gain of the parasitic bipolar transistor is higher at the corners of the hexagons, and (2) device threshold voltage is lower at the corners. The increased gain of the parasitic bipolar transistor at the corners is a significant problem because it can produce localized bipolar conduction and second breakdown type failure. For example, second breakdown and burnout at the corners can occur when a device is subjected to a reverse drain current which injects holes or electrons and is then subjected to a high dv/dt. Elaboration on this phenomenon can be found in "Catastrophic Burnout In Power VDMOS Field Effect Transistors", W. J. Slusark et al., International Reliability Physics Symposium, Phoenix, Ariz., April, 1983.

The second enumerated problem varies in significance depending upon the application in which the device is operated. The difference in threshold voltage between the corner areas 33 and the sides 35 of the channel region makes the transition between the on-state and off-state less precise than it would be if the channel region 34 had the same concentration gradient along its entire width.

Figures 2, 2A:
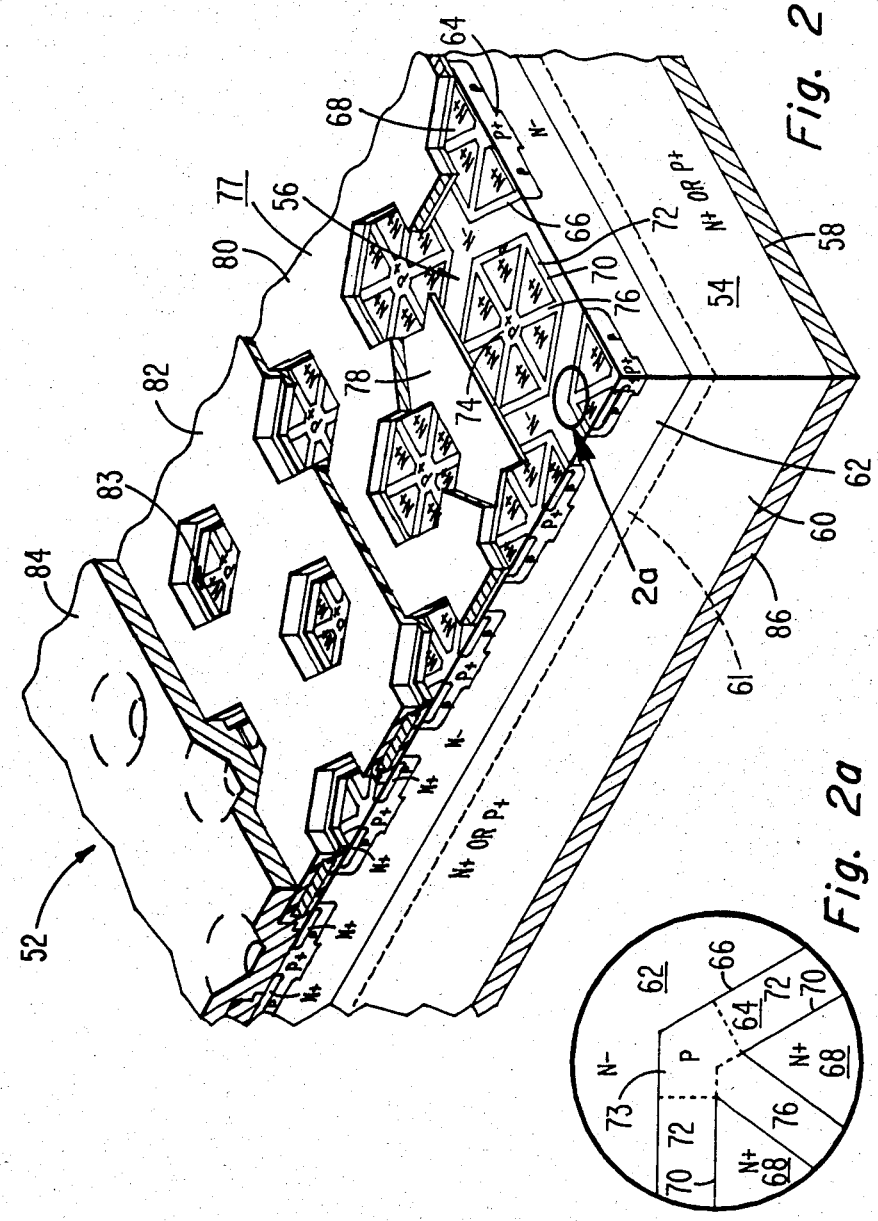
FIG. 2 is a view, partially in section, of a VDMOS device similar to the device of FIG. 1, but which incorporates the structure of the present invention.
FIG. 2A is a magnified view of a portion of FIG. 2.

As shown in FIG. 2, the geometry of a VDMOS device 52 made in accordance with the present invention eliminates the aforementioned problems. The illustrated device 52 is an N channel VDMOS structure having three or four layers of alternate conductivity type. As with the conventional device 10, the device 52 also comprises a semiconductor wafer 54 having first and second opposing major surfaces 56 and 58, and a relatively heavily doped substrate 60 contiguous with the second surface 58. In the device 52, the substrate 60 may be of either N or P type conductivity. When the substrate 60 is of N type conductivity it serves as a drain region in a three layer (source/body/drain) device. When the substrate 60 is of P type conductivity it serves as a minority carrier injecting fourth region, as described in U.S. Pat. No. 4,364,073, POWER MOSFET WITH AN ANODE REGION, H. W. Becke et al., Dec. 14, 1982, in a four layer (source/body/drain/anode) device now termed a COMFET (TM of RCA Corporation).

Disposed on the heavily doped substrate 60 and extending to the first surface 56 is a relatively lightly doped N type extended drain region 62. Additionally, it should be understood that when the substrate 60 is of P+ type material (i.e. when the N channel VDMOS device 52 is a COMFET) an N+ type drain region 61 may be disposed between the N− type extended drain region 62 and the substrate 60, as indicated in U.S. Pat. No. 4,364,073 and by the broken line in FIG. 1. It should also be understood that all of the indicated conductivity types can optionally be reversed, so as to yield a three or four layer P channel VDMOS device.

As with the conventional device 10, the device 52 includes a plurality of diffused P type body regions 64 extending from the first surface 56 into the extended drain region 62 so as to form a plurality of body/drain PN junctions 66 therewith. Again, each body/drain PN junction 66 intercepts the first surface 56 in the shape of a hexagon, and the hexagons are arranged in a two dimensional array at the wafer surface 56.

Extending from the surface 56 within the boundary of each body region 64 is a plurality of N type source regions 68. Each of the source regions 68 forms a source/body PN junction 70 with the body region 64, and each source/body PN junction 70 intercepts the first surface 56 so as to define a channel region 72 in the body region 64 at the surface 56. Thus, in the device 52 of the present invention each body region 64 includes a plurality of channel regions 72, in contrast with the single channel region 34 associated with the body region 22 of the prior art device 10.

As shown in the magnified view of FIG. 2A, the channel regions 72 in device 52 are discontinuous in the corner areas 73 of the hexagonally-shaped surface intercept of the body/drain PN junction 66. Within each body region 64, the source regions 68 are spaced from each other so as to define, at the first surface 56, a body region contact area 74 of relatively high conductivity which is substantially centrally located in the body region, and a shunt region 76 extending from the contact area 74 to each of the corner areas 73 of the body/drain PN junction 66.

An insulated gate electrode 77, comprising a gate insulator 78 on the surface 56 and a gate electrode 80 on the insulator 78 is disposed over the channel regions 72 of each body region 64 and the extended drain region 62 between body regions 64. An insulating layer 82 which includes source contact apertures 83 to the surface 56 overlies the insulated gate electrode 77. Each aperture 83 exposes the body region contact area 74 and the plurality of source regions 68 within a particular body region 64. A source electrode 84 overlies the insulating layer 82 and contacts the source regions 68 and body region contact areas 74 via the apertures 83. A drain electrode 86 is disposed across the second wafer surface 58 so as to contact the substrate 60.

Figure 3:
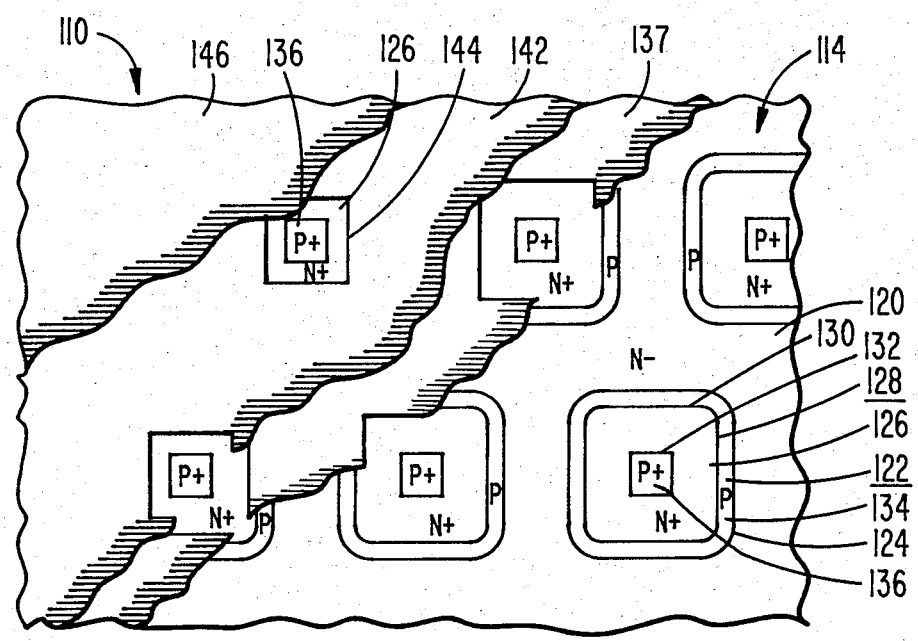
FIG. 3 is a top view, with certain layers partially removed, of a conventional VDMOS structure having a square body region structure.
Figure 4:
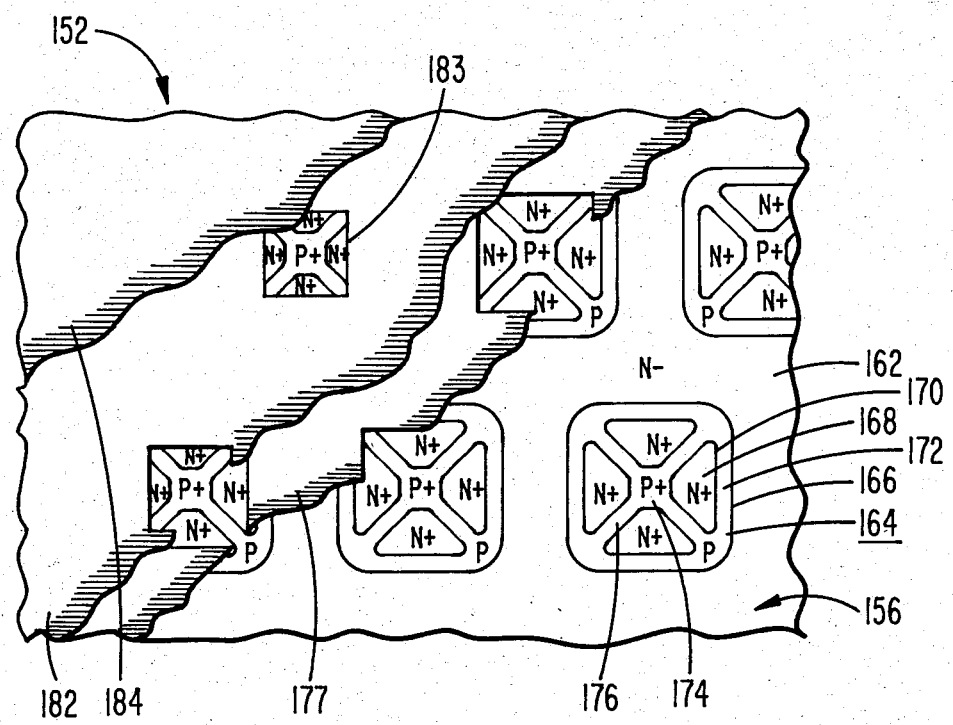
FIG. 4 is a top view of a VDMOS device similar to the device of FIG. 3 but which includes the structure of the present invention.

Another frequently used VDMOS device configuration is based on a layout of substantially square body regions, as illustrated in FIGS. 3 and 4. These two figures illustrate, respectively, top views of a conventional VDMOS device 110 and a VDMOS device 152 incorporating the present invention, with portions overlying the semiconductor surfaces partially cut away. The VDMOS device 152 of the present invention may incorporate 3 layers or 4 layers, and it may be an N channel or a P channel structure, as with the device 52 of FIG. 2. In that devices 110 and 152 are analogous to devices 10 and 52 respectively, those portions of devices 110 and 152 which correspond to portions of devices 10 and 52 are identified by a similar reference numbers preceded by the numeral 1. The essential difference between the devices 10 and 52 and the devices 110 and 152 is the geometric shape of the source and body regions therein.

As shown in FIG. 3, the conventional device 110 includes a lightly doped N type extended drain region 120 at wafer surface 114 and a plurality of diffused P type body regions 122 which intercept the surface 114 so as to form a plurality of square-shaped body/drain PN junctions 124 thereon. An N type source region 126 having a source/body PN junction 128 is disposed within the boundary of the body region 122; the source/body PN junction 128 having a peripheral portion 130 and a central portion 132. The peripheral portion 130 is spaced from the body/drain junction 124 so as to define a channel portion 134 in the body region at the surface 114. A relatively high conductivity portion of the body region, hereinafter the body region contact area 136 is defined by the central portion 132.

An insulated gate electrode 137 overlies the channel portion of each of the body regions and the extended drain region 120 therebetween. An apertured insulating layer 142 overlies the insulated gate electrode 137, and a source electrode 146 overlies the insulating layer 142 and contacts each source region 126 and body region contact area 136 through a source contact area aperture 144 in the insulating layer 142.

As illustrated in FIG. 4, the VDMOS device 152 includes an N type extended drain region 162 at wafer surface 156 and includes a plurality of P type diffused body regions 164 which intercept the surface so as to form a plurality of square-shaped body/drain PN junctions 166 thereon. Within each body region 164 a plurality of N type source regions 168 is disposed. For a square-shaped body/drain PN junction surface intercept, the preferred embodiment of the invention utilizes four source regions 168, each forming a source/body PN junction 170 at its interface with the body region 164. At the surface 156, the source/body PN junction 170 for each source region 168 within a particular body region 164 is spaced from the body/drain junction 166 so as to form a channel region 172 along the side of each square-shaped body/drain PN junction surface intercept. Additionally, the plurality of source region 168 defines a substantially centrally located contact area 174 at the surface of the body region 164. Extending from the body region contact area 174 to at least one of the corners of the body/drain PN junction surface intercept, and preferably to each of the corners, is a shunt region 176 portion of the body region.

An insulated gate electrode 177 overlies each of the channel regions on the surface 156 and the extended drain region 162 between body regions. An insulating layer 182 having a source contact aperture 183 to each body region contact area 174 and each of the surrounding source regions 168 within a particular body region overlies the insulated gate electrode 177. A source electrode 184 overlies the insulating layer 182 and contacts the body region contact areas and the surrounding source regions exposed each aperture 183.

The essential distinguishing feature between a device incorporating the present invention and a conventional device is the configuration of the source region(s). A device of the present invention can be fabricated in a substantially similar conventional manner. The significant difference in the processing sequence for a device of the invention occurs prior to the source region diffusion or implantation and diffusion.

As previously described with reference to the conventional device 10 of FIG. 1, both the source and body region dopants are diffused through the apertures 50 in the insulated gate electrode 37. However, when the source region dopants are introduced at the wafer surface 14, an additional masking layer, such as photoresist, is typically provided over the centrally located body contact area 36. To produce a device of the present invention, this additional masking layer can be modified so as to additionally include portions overlying areas where the shunt regions are to be formed. The invention can thus be readily implemented into an existing VDMOS processing sequence.

In the conventional device 10, the parasitic NPN bipolar transistor which includes the corner areas 33 of the body region 22 as its base has a higher gain than the parasitic NPN bipolar transistor which incorporates the side portions 35 as its base. The structure of the present invention advantageously eliminates the parasitic bipolar transistor at the corner areas of the body region by physically eliminating the source region 26 (the emitter of the parasitic bipolar transistor) adjacent to the corner areas 33. This can be readily observed by a comparison between FIG. 1A and FIG. 2A. Essentially, the source region 26 adjacent to the corner area 33 is replaced by a P type shunt region 76 in the device of the present invention.

In addition to eliminating the parasitic bipolar transistor from the corners, the structure of the present invention reduces the emitter shunt resistance of the parasitic bipolar transistors associated with the remaining channel reigons 72. As shown in FIG. 1, in the conventional device 10 the emitter of the parasitic bipolar transistor (source region 26) is shunted by the resistive path through the body region 22 beneath the source region 26 and the body region contact area 36 to the source electrode 46 contact at the surface 14. In contrast, as shown in FIG. 2, the presence of the shunt regions 76 significantly reduce the distance in which current must flow to reach the source electrode 84. This reduced shunt resistance provides a device with a capability of tolerating higher displacement currents and stored-charge currents without being damaged.

The advantages of having the reduced emitter shunt resistance are particularly notable when the device 52 (or 152) is a four layer COMFET structure. In a COMFET structure one species of carrier is supplied entirely by the MOS channel portion while the other species is supplied entirely by injection from the substrate into the extended drain region. In the illustrated N channel devices, the channel portions supply electrons and the substrate supplies holes. As long as the electrons are supplied only by the channel portion, the device can be controlled entirely by controlling the gate voltage. If, however, the source/body PN junction 70 (i.e. the emitter/base junction of the parasitic bipolar transistor) becomes biased, the source region can continue to inject electrons after the inversion channel has been removed, thereby causing the device to remain in the conducting stage (i.e. to latch in the manner of a regenerative thyristor) after the gate voltage has been removed. With the reduced emitter shunt resistance of the devices of the present invention, a COMFET can carry higher current before latching occurs. Thus, the useful operating range of the devices 52 and 152 is greater than that of devices 10 and 110.

It should also be understood by those skilled in the art that the invention is not limited to the specific structures disclosed herein. For example, only a single body region is required, and when a plurality of body regions is utilized the body regions may be interconnected by a stripe or stripes of similar conductivity type. Additionally, the invention is not limited to vertical structures wherein the source and drain electrodes are on opposite semiconductor wafer surfaces. Drain electrode contact to the extended drain region of a 3 layer device or to the fourth layer of a COMFET can be made on the same semiconductor wafer surface as the source electrode contact. Furthermore, it should be understood that although the invention is described in terms of metal oxide semiconductor structures, it is applicable to insulated gate FETs generally.

What is claimed is:

1. An IGFET device comprising:
   a semiconductor wafer including a drain region of first conductivity type contiguous with a wafer surface;
   a diffused body region of second conductivity type extending into the wafer from said wafer surface so as to form a body/drain PN junction having an intercept at said surface, said intercept having a substantially polygonal shape;
   a plurality of source regions of first conductivity type extending into the wafer from said surface within the boundary of the body region, each source region forming a source/body PN junction which is spaced from said body/drain PN junction so as to define a channel region in the body region at said surface, and each of the source/body PN junctions being spaced from each other so as to define, in the body region, at the wafer surface, a contact area and at least one shunt region, each shunt region extending from said contact area to a corner of said polygonally-shaped body/drain PN junction intercept; and
   a source electrode which contacts said body region contact area and each of the shunt regions and source regions adjacent thereto.

2. A device in accordance with claim 1 wherein said drain region is contiguous with an opposing wafer surface, and a drain electrode contacts the opposing wafer surface.

3. A device in accordance with claim 1 wherein said contact area is substantially centrally located within said body region.

4. A device in accordance with claim 1 further comprising a fourth region of second conductivity type contiguous with said drain region.

5. A device in accordance with claim 4 wherein said fourth region is contiguous with an opposing wafer surface.

6. A device in accordance with claim 5 further comprising a drain electrode which contacts said fourth region on said opposing wafer surface.

7. A device in accordance with claim 1 wherein said intercept is square-shaped.

8. A device in accordance with claim 7 further comprising a shunt region extending to each corner of said square-shaped intercept.

9. A device in accordance with claim 1 wherein said intercept is hexagonally-shaped.

10. A device in accordance with claim 9 comprising a shunt region extending to each corner of said hexagonally-shaped intercept.

11. A device in accordance with claim 1 further comprising a plurality of said diffused body regions, said source electrode contacting each of said body regions.

12. A device in accordance with claim 1 wherein said body region contact area is of relatively high conductivity compared to said channel regions.

* * * * *